(12) United States Patent
Chevalier (10) Patent No.: US 10,374,069 B2
(45) Date of Patent: Aug. 6, 2019

(54) BIPOLAR TRANSISTOR AND METHOD OF MANUFACTURING THE SAME

(71) Applicant: STMicroelectronics SA, Montrouge (FR)

(72) Inventor: Pascal Chevalier, Chapareillan (FR)

(73) Assignee: STMicroelectronics SA, Montrouge (FR)

( * ) Notice: Subject to any disclaimer, the term of this patent is extended or adjusted under 35 U.S.C. 154(b) by 0 days.

(21) Appl. No.: 15/840,890

(22) Filed: Dec. 13, 2017

(65) Prior Publication Data

US 2018/0108762 A1 Apr. 19, 2018

Related U.S. Application Data

(62) Division of application No. 15/221,051, filed on Jul. 27, 2016, now Pat. No. 9,882,034.

(30) Foreign Application Priority Data

Feb. 16, 2016 (FR) ...................................... 16 51251

(51) Int. Cl.
*H01L 29/08* (2006.01)
*H01L 29/10* (2006.01)
(Continued)

(52) U.S. Cl.
CPC .......... *H01L 29/732* (2013.01); *H01L 21/308* (2013.01); *H01L 29/0804* (2013.01);
(Continued)

(58) Field of Classification Search
None
See application file for complete search history.

(56) References Cited

U.S. PATENT DOCUMENTS 3,878,552 A * 4/1975 Rodgers ................ H01L 21/764
148/DIG. 115
4,929,570 A * 5/1990 Howell ............ H01L 21/76294
257/370

(Continued)

FOREIGN PATENT DOCUMENTS

EP 1087424 A1 3/2001

OTHER PUBLICATIONS

INPI Search Report and Written Opinion for FR 1651251 dated Oct. 13, 2016 (10 pages).
(Continued)

*Primary Examiner* — Erik Kielin
(74) *Attorney, Agent, or Firm* — Crowe & Dunlevy (57) ABSTRACT

A bipolar transistor is supported by a single-crystal silicon substrate including a collector contact region. A first epitaxial region forms a collector region of a first conductivity type on the collector contact region. A second epitaxial region forms a base region of a second conductivity type. Deposited semiconductor material forms an emitter region of the first conductivity type. The collector region, base region and emitter region are located within an opening having sidewalls lined with an insulating sheath. A portion of the insulating sheath adjacent the base region is removed and a base contact region is formed by epitaxial material grown from a portion of the base region exposed by removal of the portion of the insulating sheath.

12 Claims, 6 Drawing Sheets

(51) Int. Cl.
  *H01L 29/66*      (2006.01)
  *H01L 21/308*     (2006.01)
  *H01L 29/732*     (2006.01)
  *H01L 29/737*     (2006.01)

(52) U.S. Cl.
  CPC ...... *H01L 29/0821* (2013.01); *H01L 29/1004* (2013.01); *H01L 29/66242* (2013.01); *H01L 29/66272* (2013.01); *H01L 29/7371* (2013.01)

(56) References Cited

U.S. PATENT DOCUMENTS

| | | |
|---|---|---|
| 2001/0017399 A1 | 8/2001 | Oda et al. |
| 2002/0053705 A1 | 5/2002 | Kondo et al. |
| 2005/0199909 A1* | 9/2005 | Murayama .......... H01L 29/0817 257/197 |
| 2007/0275533 A1 | 11/2007 | Vaed et al. |
| 2010/0187657 A1 | 7/2010 | Boeck et al. |
| 2013/0270649 A1 | 10/2013 | Chantre et al. |
| 2015/0140771 A1 | 5/2015 | Fox et al. |
| 2017/0236923 A1 | 8/2017 | Chevalier |

OTHER PUBLICATIONS

Diop, et al., "Impact of inside spacer process on fully self-aligned 250 GHz SiGe:C HBTs reliability performances: a-Si vs. nitride," Microelectronics Reliability, vol. 48, Issues 8-9, Aug.-Sep. 2008, pp. 1198-1201.

\* cited by examiner

BIPOLAR TRANSISTOR AND METHOD OF MANUFACTURING THE SAME

CROSS REFERENCE TO RELATED APPLICATIONS

This application is a divisional of U.S. application Ser. No. 15/221,051 filed Jul. 27, 2016, which claims the priority benefit of French Application for Patent No. 1651251, filed on Feb. 16, 2016, the disclosures of which are hereby incorporated by reference in their entireties to the maximum extent allowable by law.

TECHNICAL FIELD

The present disclosure relates to a bipolar transistor and to a method of manufacturing the same.

BACKGROUND

For high-frequency applications, bipolar transistors, and in particular heterojunction bipolar transistors (HBT), are currently used. It is known to integrate bipolar transistors in standard CMOS methods.

The forming of a bipolar transistor from a stack of semiconductor regions forming the emitter, the base, and the collector of the transistor poses various problems. In particular, a problem is to form a base contact region while keeping a low resistance of access to the base region and a low stray capacitance between the base and the collector.

It would thus be desirable to have a bipolar transistor and a method of manufacturing the same solving at least some of the problems of existing bipolar transistors.

SUMMARY

Thus, an embodiment provides a bipolar transistor manufacturing method comprising the successive steps of:

a) providing a single-crystal silicon substrate successively coated with a first insulating layer, with a first silicon layer, and with a stack of layers comprising a sacrificial layer made of a first material arranged between two insulating layers made of a second material selectively etchable over the first material;

b) etching an opening all the way to the substrate, and covering the lateral walls of the opening with an insulating sheath;

c) in the opening, forming by selective epitaxy, all the way to a level between the upper level of the first silicon layer and the lower level of the sacrificial layer, a collector region made of doped silicon of a first conductivity type and then, all the way to a level higher than or equal to the upper level of the sacrificial layer, a doped base semiconductor layer of the second type;

d) depositing a second doped silicon layer of the first type filling the opening and then etching all the way to the sacrificial layer, a portion of the second silicon layer resting on the base semiconductor region and extending beyond the base semiconductor region on either side thereof being left in place and forming an emitter region;

e) selectively removing the sacrificial layer and the portion opposite said sheath; and f) forming a base contact region by epitaxy from the side of the base semiconductor region.

According to an embodiment, a first portion of the base contact region is formed at step f), and a second portion of the base contact region is formed, after step f), during the successive steps of:

g) etching the remaining layers of the stack all the way to the first silicon layer while leaving in place said sheath on the side of the collector region; and h) forming the second portion of the base contact region by epitaxy from the first silicon layer and from the first portion of the base contact region.

According to an embodiment, at step e), the remaining layers of the stack are etched and, at step f), the base contact region is formed by epitaxy from the base semiconductor region and from the first silicon layer.

According to an embodiment, the first silicon layer is a single-crystal silicon layer of a structure of silicon-on-insulator type.

According to an embodiment, the first silicon layer has a doping of the second type.

According to an embodiment, the method further comprises, after the forming of the base contact region, the successive steps of:

i) forming a mask covering the emitter region and portions of the base contact region extending laterally from the base semiconductor region, etching all the way to the substrate by using the mask, and removing the mask;

j) exposing the top of the emitter region and siliciding exposed portions of the base contact region, of the emitter region, and of the substrate; and k) covering with an insulator, and then forming conductive vias crossing the insulator all the way to the silicided portions.

According to an embodiment, said opposite portion is made of the same material and is thinner than the sacrificial layer.

According to an embodiment, at step a), the stack comprises, under the sacrificial layer, at least another insulating layer made of the material of the insulating sheath, each of said at least another insulating layer being thinner than the insulating sheath.

According to an embodiment, at step e), prior to the etching of the sacrificial layer, a second insulating layer is formed around the emitter region, the first material being selectively etchable over the material of the second insulating layer.

According to an embodiment, step d) comprises, prior to the etching, the steps of forming another mask topping the entire base semiconductor region and laterally extending beyond the base semiconductor region, and removing the other mask after the etching.

According to an embodiment, the first material is silicon oxide and the second insulating material is silicon nitride.

According to an embodiment, the method further comprises, between steps c) and d), forming spacers resting on the base semiconductor layer and bordering the insulating sheath all the way to the top of the opening.

An embodiment provides a bipolar transistor comprising a single-crystal silicon substrate; a doped silicon collector region of the first type resting on the substrate and topped with a doped base semiconductor region of the second type, the side of the collector region being coated with an insulating sheath and being aligned with the side of the base semiconductor region; a doped silicon emitter region of the first type resting on the base semiconductor region and laterally extending beyond the base semiconductor region; and a stack surrounding the collector region and bordering said sheath along its entire height, the stack resting on the substrate and comprising a first insulating layer topped with a first silicon layer, itself topped with a doped silicon base contact region of the second type laterally extending all the way to the side of the base semiconductor region.

According to an embodiment, the bipolar transistor further comprises silicided portions arranged at the top of the emitter region, at the level of the upper surface of the substrate and, partly, opposite the side of the base semiconductor region, at the level of the upper surface of the base contact region.

According to an embodiment, the upper level of the collector region is lower than or equal to the lower level of the base contact region.

BRIEF DESCRIPTION OF THE DRAWINGS

The foregoing and other features and advantages will be discussed in detail in the following non-limiting description of specific embodiments in connection with FIGS. 1 to 11, these drawings being cross-section views illustrating steps of an embodiment of a bipolar transistor manufacturing method.

DETAILED DESCRIPTION

The same elements have been designated with the same reference numerals in the various drawings and, further, the various drawings are not to scale. For clarity, only those elements which are useful to the understanding of the described embodiments have been shown and are detailed. In particular, certain masks used during the steps of the manufacturing method described hereafter have not been shown.

In the following description, terms "high", "side", "lateral", "top", "above", "under", "on", "upper", and "lower" refer to the orientation of the concerned elements in the corresponding drawings.

Figure 1:
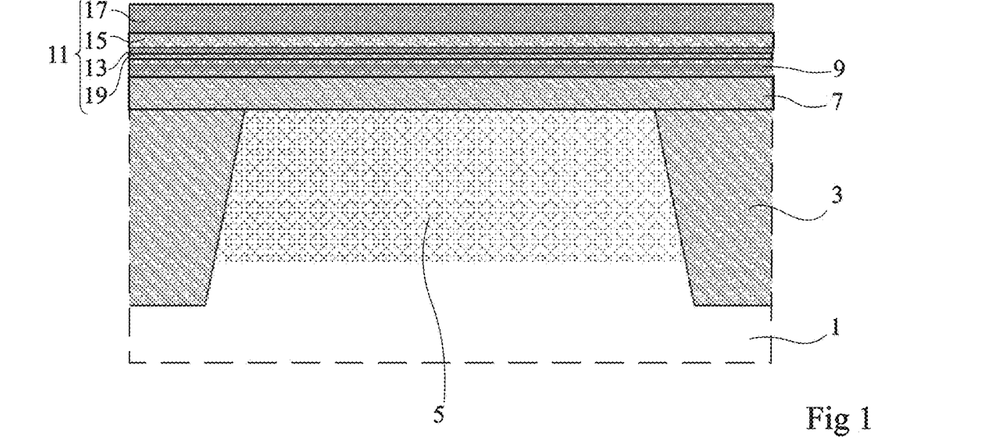

FIG. 1 is a cross-section view of a structure at a step of an embodiment of a bipolar transistor manufacturing method.

The structure comprises a single-crystal silicon substrate 1 where insulating structures 3 may be provided to delimit the location where the transistor is desired to be formed. At the location of the transistor, substrate 1 comprises a heavily-doped collector contact region 5 of a first conductivity type, for example, type N, region 5 being flush with the upper surface of substrate 1.

The upper surface of substrate 1 is coated with an insulating layer 7, itself coated with a silicon layer 9. Layer 9 may be a polysilicon layer deposited on insulating layer 7. Layer 9 may also be a single-crystal silicon layer for example corresponding to the silicon layer of a structure of SOI type (Semiconductor On Insulator). Layer 9 may have a doping of the second conductivity type, for example, type P.

A stack of layers 11 rests on silicon layer 9. Stack 11 comprises an insulating layer 13 coated with a sacrificial layer 15, itself coated with an insulating layer 17. The material of layer 15 and the material of layers 13 and 17 are selected to be selectively etchable over each other. According to a first embodiment illustrated in FIG. 1 and in the following FIGS. 2 to 11, layers 13 and 17 are made of silicon nitride and layer 15 is made of silicon oxide. According to a second embodiment, layers 13 and 17 are made of silicon oxide and layer 15 is made of polysilicon or amorphous silicon, or of polycrystalline or amorphous silicon-germanium. In the first and second embodiments, stack 11 may comprise other insulating layers, for example, a silicon oxide layer 19 arranged between silicon layer 9 and insulating layer 13.

Figure 2:
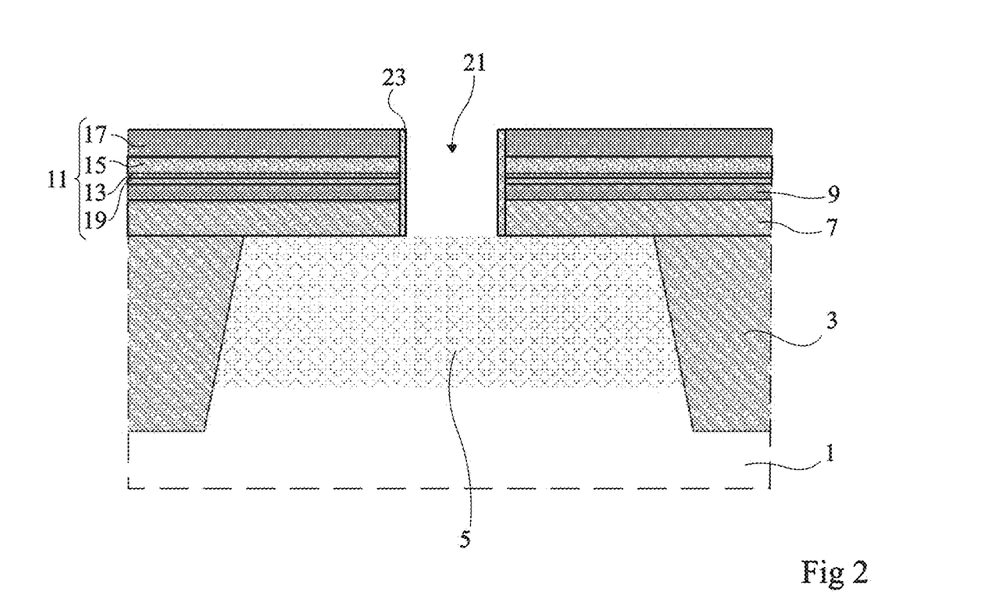

FIG. 2 shows the structure of FIG. 1 after the etching of an opening 21 crossing stack 11, silicon layer 9, and insulating layer 7 all the way to collector contact region 5. The etching of opening 21 has been followed by the forming of an insulating layer, or sheath, 23 covering the lateral walls of opening 21. Insulating sheath 23 is, for example, made of silicon oxide. According to the first embodiment, it is thus made of the same material as sacrificial layer 15 and is then thinner than layer 15. Further, in the first and second embodiments, in the case where stack 11 comprises, under layer 15, other insulating layers made of the same material as insulating sheath 23, the latter is then thicker than each of these other insulating layers. Thus, sheath 23 is thicker than layer 19.

Figure 3:
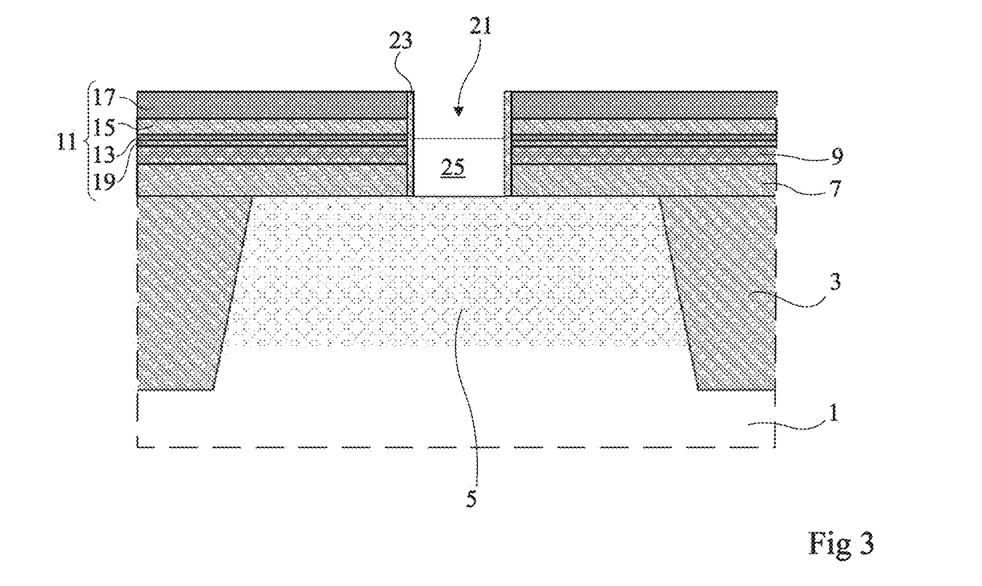

FIG. 3 shows the structure of FIG. 2 after the forming, in opening 21, of collector region 25 of the transistor. Collector region 25 is made of single-crystal silicon formed by selective epitaxy from the surface of substrate 1 all the way to a level higher than that of silicon layer 9 and lower than or equal to that of sacrificial layer 15. Preferably, the level of the upper surface of collector region 25 is slightly lower, for example, by from 1 to 3 nm, than that of the lower surface of layer 15. Collector region 25 is doped with the first conductivity type, during the epitaxy or by implantation after the epitaxy. As an example, the collector region is doped with phosphorus atoms, possibly associated with carbon atoms to limit the exodiffusion of phosphorus atoms, and/or with arsenic atoms.

According to the second embodiment, after the growth of collector region 25, the upper exposed surface of silicon oxide sheath 23 is removed by etching, and then replaced with a silicon nitride sheath portion. The material of layer 15 and the material of the portion of sheath 23 opposite layer 15 are advantageously selectively etchable over each other.

Figure 4:
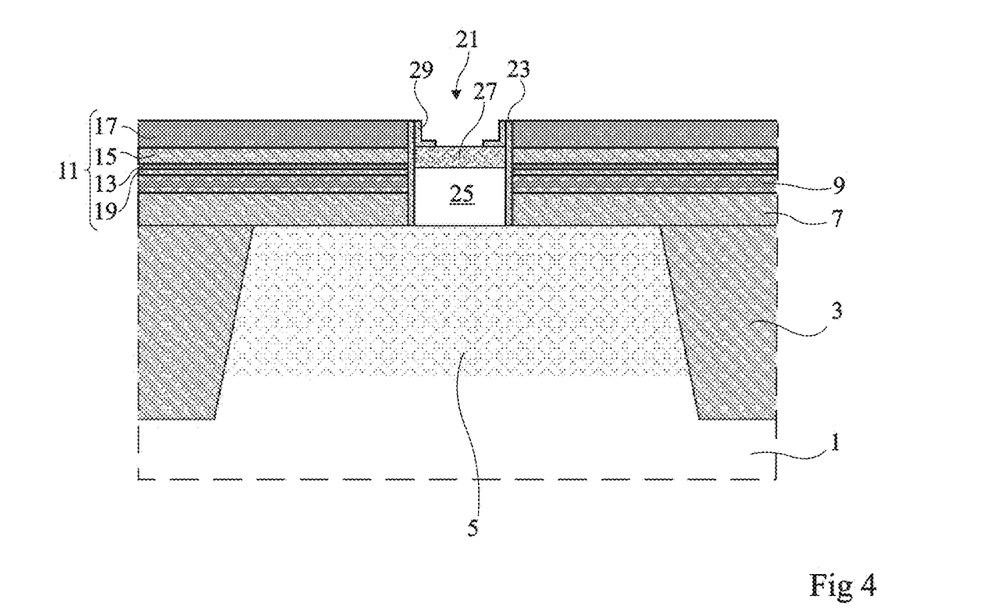

FIG. 4 shows the structure of FIG. 3 after the forming, in opening 21, of base region 27 of the transistor. Base region 27 is made of a single-crystal semiconductor material such as silicon or, preferably, silicon-germanium as in the present embodiment. Base region 27 is formed by selective epitaxy from collector region 25 all the way to a level higher than or equal to the upper level of sacrificial layer 15. Preferably, the upper surface level of base region 27 is slightly higher, for example, by from 1 to 3 nm, than that of the upper surface of layer 15. Base region 27 is doped with the second conductivity type, preferably during the epitaxy. As an example, base region 27 is doped with boron atoms, possibly associated with carbon atoms to avoid the exodiffusion of the boron atoms.

Spacers 29 have preferably been formed in opening 21. Spacers 29 rest on base region 27 and border, up to the top of the opening, an upper portion of insulating sheath 23. The spacers have, for example, in cross-section view, an L shape as shown in FIG. 4. As an example, spacers 29 are made of silicon oxide. Thus, in the second embodiment, the material of spacers 29 and the material of the upper portion of sheath 23 bordered with spacers 29 are advantageously selectively etchable over each other.

Figure 5:
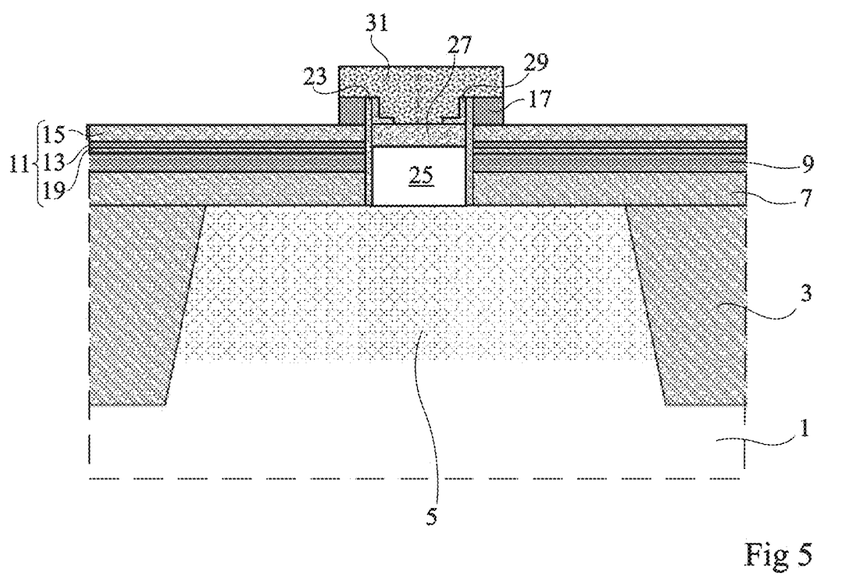

FIG. 5 shows the structure of FIG. 4 after the forming of emitter region 31 of the transistor. To achieve this, a doped silicon layer of the first conductivity type is deposited all over the structure and fills opening 21. As an example, the silicon layer is deposited by RTCVD ("Reduced Temperature Chemical Vapor Deposition"), which enables the deposited silicon to be monocrystalline around base region 27. An etch mask, not shown, topping the entire base region 27 and laterally extending with respect to the base region is then formed above this deposited silicon layer. An anisotropic etch step is then performed all the way to sacrificial layer 15, after which the etch mask is removed. Thus, a portion of the deposited silicon layer is left in place and forms emitter region 31. Emitter region 31 comprises a central portion resting on base region 27, and a peripheral portion laterally extending beyond base region 27 and resting on portions of insulating layers. In the first embodiment, the peripheral portion of emitter region 31 for example rests on portions of insulating layer 17. In the second embodiment, the peripheral portion of emitter region 31 for example rests on portions of layer 17 coated with portions of the silicon nitride layer deposited at the step of FIG. 3 to replace the upper portion of sheath 23.

Figure 6:
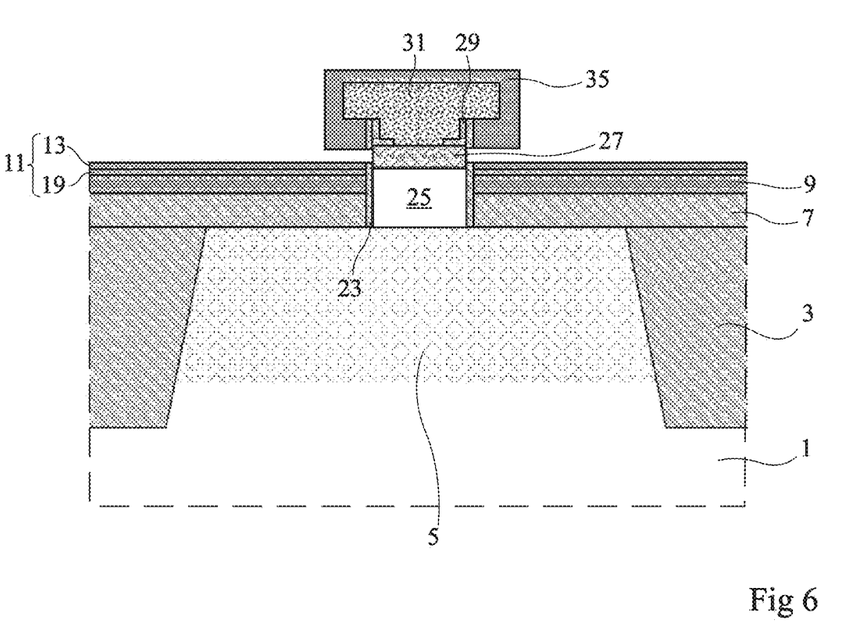

FIG. 6 shows the structure of FIG. 5 after the deposition of an insulating material 35 on the exposed portions of emitter region 31, insulating material 35 covering the top of emitter region 31 and forming spacers laterally bordering emitter region 31 and the portions of insulating layers supporting the peripheral portion of emitter region 31. In the first embodiment, the insulating material is silicon nitride. In the second embodiment, insulating material 35 comprises a silicon nitride layer laterally bordering emitter region 31 and coated with a silicon oxide layer.

Further, at the step illustrated in FIG. 6, sacrificial layer 15 has been removed by isotropic etching selective over the material of layers 13 and 17. In the first embodiment, due to the fact that sacrificial layer 15 is made of the same material and is thicker than the portion of sheath 23 opposite layer 15, this etch step also causes the removal of this portion opposite sheath 23. In the second embodiment, the etching to remove sacrificial layer 15 is, further, selective over the silicon nitride of the portion opposite sheath 23. This portion opposite sheath 23 is exposed due to the removal of layer 15, and is then removed by selective etching over the material of layers 13 and 15. It should be understood that, unlike the first embodiment where layer 15 and sheath 23 are made of the same material, in the second embodiment, the portion opposite sheath 23 may have a thickness greater than or equal to that of sacrificial layer 15. In this second embodiment, advantageously, the etching of the portion opposite sheath 23 is also selective over the material of spacers 29, which enables to avoid an overetching of spacers 29.

In the first and second embodiments, since at least a portion of base region 27 is located at the same level as layer 15, the selective removal of layer 15 and of the portion opposite sheath 23 enables to expose at least a portion of the side, or lateral periphery, of base region 27.

Figure 7:
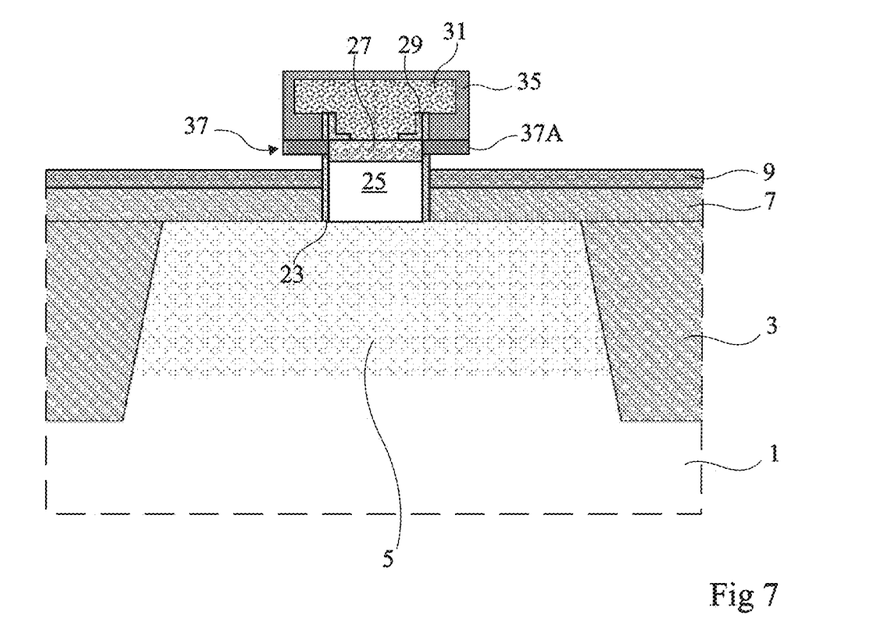

FIG. 7 shows the structure of FIG. 6 after the forming of a first portion 37A of a base contact region 37 followed by the removal of the remaining insulating layers of stack 11 to expose silicon layer 9. Portion 37A of base contact region 37 is formed by selective epitaxy of doped silicon of the second conductivity type, from the side of base region 27. Thus, portion 37A of base contact region 37 is monocrystalline, which advantageously enables to decrease the resistance at the interface between base contact region 37 and base region 27 with respect to the case of a transistor which would have its base contact region made of polysilicon. In this example, portion 37A of base contact region 37 extends laterally all the way to the peripheral edge of insulating material 35. The remaining layers of stack 11 are then removed by etching without affecting the integrity of sheath 23, for example, by having selected a thickness smaller than that of silicon oxide sheath 23 for the remaining layers which are also made of silicon oxide. Thus, after the removal by etching of the remaining layers of stack 11, sheath 23 advantageously remains in place on the side of collector region 25, and possibly on a portion of the side of base region 27.

Figure 8:
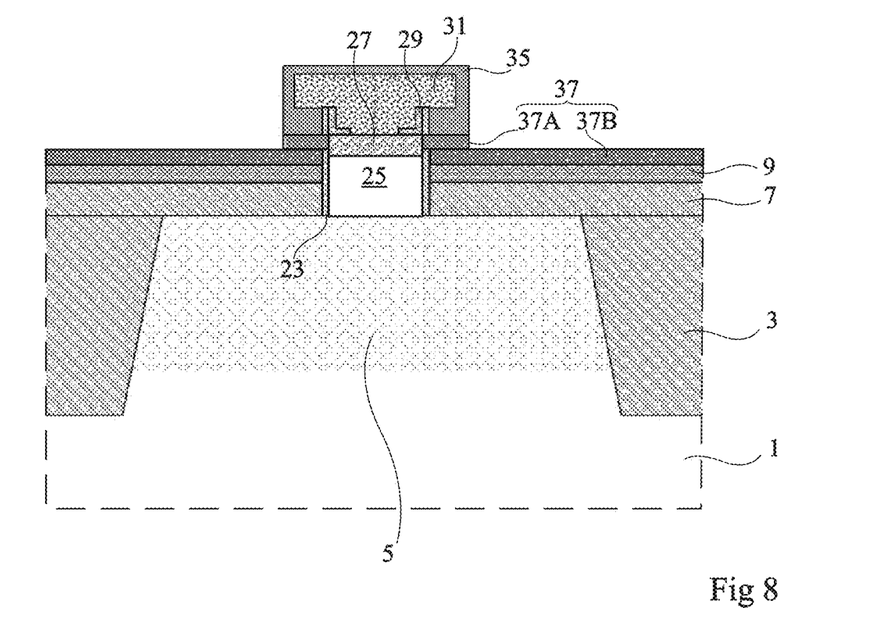

FIG. 8 shows the structure of FIG. 7 after the forming of a second portion 37B of base contact region 37. Second portion 37B is formed by selective epitaxy of doped silicon of the second conductivity type, based on silicon layer 9 and on first portion 37A of base contact region 37. In the case where silicon layer 9 has not been doped at the step of FIG. 1, it may be doped by diffusion of dopant atoms from base contact region 37, and in particular from portion 37B of base contact region 37.

Advantageously, when one has started from a SOI-type structure and layer 9 is made of single-crystal silicon, second portion 37B of base contact region 37 is also made of single-crystal silicon. Thus, the entire base contact region 37 is made of single-crystal silicon, which enables to decrease the resistance of base contact region 37, and thus the resistance of access to base 27, with respect to the case of a transistor where all or part of the base contact region is made of polysilicon.

Figure 9:
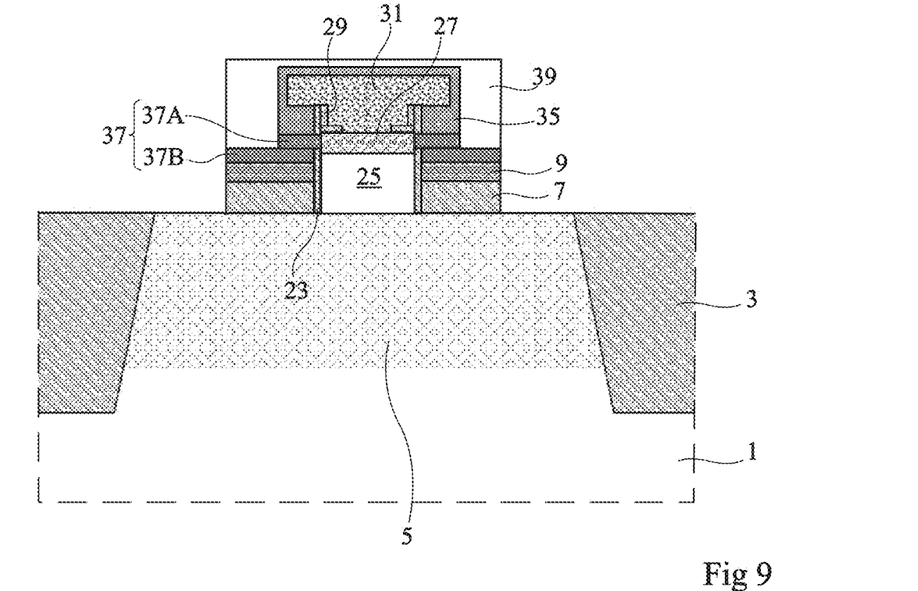

FIG. 9 shows the structure of FIG. 8 after a step of masking and etching all the way to substrate 1 to expose a portion of collector contact region 5. To achieve this, a mask 39 has been formed all over emitter region 31 and on portions of base contact region 37 laterally extending beyond emitter region 31. As a result, after etching, insulating sheath 23 covering the side of collector region 25 is bordered all along its height with a stack comprising portions of layers 7, 9, and of base contact region 37. These portions of layers 7, 9, and of region 37 are separated from collector region 25 by insulating sheath 23, whereby, advantageously, base contact region 37 is electrically insulated from collector region 25 by insulating sheath 23.

Figure 10:
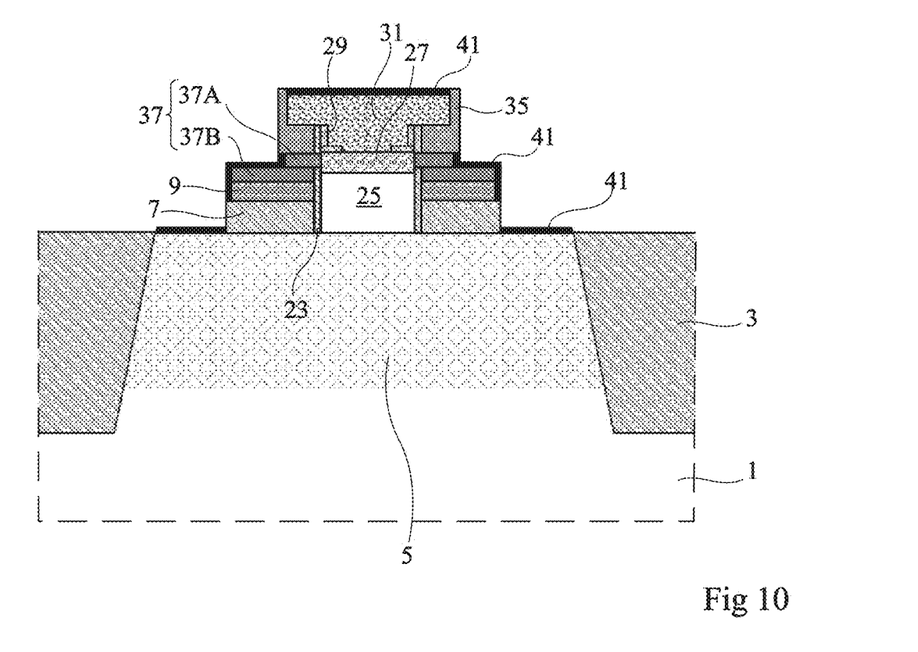

FIG. 10 shows the structure of FIG. 9 after the removal of mask 39, an etching to expose to the top of emitter region 31, and the forming of silicided portions 41 at the level of the exposed silicon surfaces. Thus, silicided portions 41 are formed at the top of emitter region 31, on the upper surface of collector contact region 5, and on base contact region 37.

Figure 11:
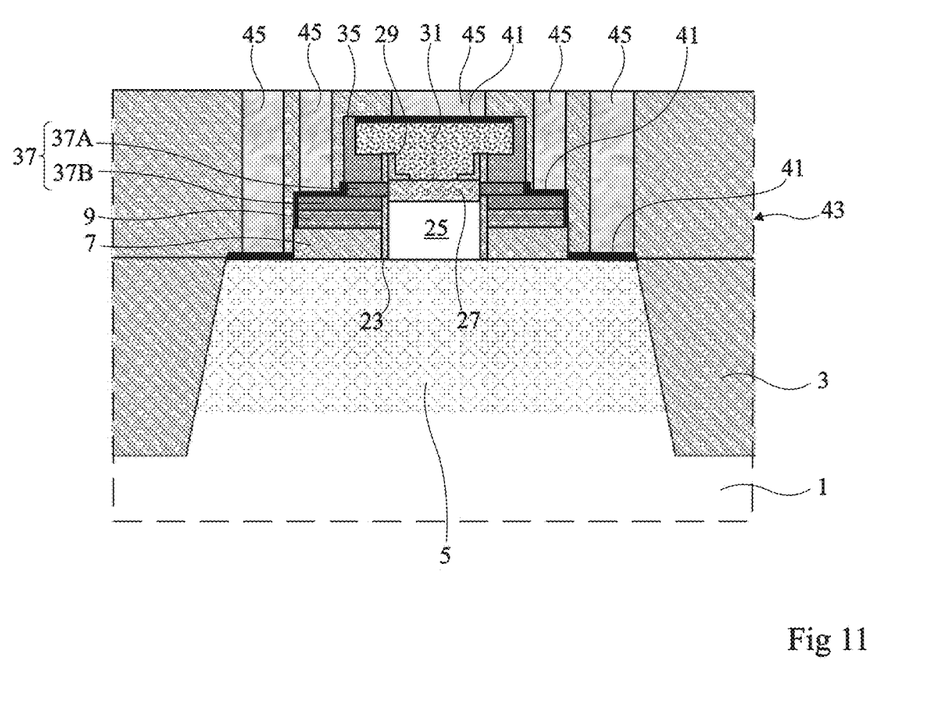

FIG. 11 shows the structure of FIG. 10 after the deposition of an insulating layer 43 covering the structure, and the forming of conductive vias 45 crossing layer 43 all the way to silicided portions 41. As an example, layer 43 comprises a silicon nitride layer coated with a silicon oxide layer. A step of chem.-mech. polishing (CMP) of the silicon oxide layer may be carried out so that the upper surface of layer 43 is planar and reaches a level higher than that of emitter region 31.

In an alternative embodiment of the method described in relation with FIGS. 1 to 11, and preferably when layer 9 is made of single-crystal silicon, the two portions 37A and 37B of base contact region 37 may be formed simultaneously. To achieve this, at the step illustrated in FIG. 6, after having removed layer 15 and the opposite portion of sheath 23 by etching, the remaining layers 13 and 19 of stack 11 are removed by etching to expose silicon layer 9. The two portions 37A and 37B of base contact region 37 are then simultaneously formed by epitaxy from the side of base region 27 and of silicon layer 9. A structure similar to that of FIG. 8 is then obtained.

In the transistor of FIG. 11, base contact region 37 is insulated from collector region 25 by sheath 23 and is only in contact with base region 27 at the level of all or part of the side of region 27. As a result of such a configuration, the diffusion of the dopant atoms from base contact region 37 to collector region 25 is less significant than in the case of a bipolar transistor which would have its base contact region rest on a portion of the base region resting on collector region 25. As a result, the base-collector capacitance of the transistor of FIG. 11 is lower than that of a transistor which would have its base contact region resting on a portion of the base region resting on collector region 25. Thus, the doping level of base contact region 37 may be increased to decrease the resistance of access to base 37 without for this to increase the base-collector capacitance of the transistor.

In the transistor of FIG. 11, the base-collector capacitance may be decreased by increasing the thickness of insulating sheath 23 and/or of insulating layer 7 without for this to increase the resistance of base contact region 37.

Advantageously, in the transistor of FIG. 11, the shortest conductive path between base region 27 and silicided portions 41 of base contact region 37 is made of single-crystal silicon. As a result, the resistance of access to base 27 is lower than in the case of a transistor where this shortest conductive path would be at least partially made of polysilicon.

Further, in the transistor of FIG. 11, the upper level of base contact region 37 is lower than or equal to the lower level of emitter region 31. This enables to decrease the stray capacitance between base contact region 37 and emitter region 31 as compared with the case of a transistor which would have its base contact region bordering a lower portion of emitter region 31.

In the previously-described method, spacers 29 formed at the step of FIG. 4 enable to decrease the risk of short-circuit between base contact region 37 and emitter region 31 which may result from the removal by etching of the portion of sheath 23 opposite layer 15. Spacers 29 also enable to limit leakage currents and to decrease the base-emitter capacitance of the transistor, particularly by controlling the extension of the contact surface area between the base and the emitter.

Advantageously, the previously-described method enables to form in self-aligned fashion the collector region 25, base region 27, and emitter region 31 of a bipolar transistor without providing many masking and/or etch steps.

Each step of the previously-described method is a step currently used in standard CMOS methods, whereby this method is compatible with standard CMOS methods.

As an example, the various previously-described layers, regions, portions may have the following dimensions:
- a thickness in the range from 10 to 75 nm, for example, 25 nm, for insulating layer 7;
- a thickness in the range from 3 to 20 nm, for example, 7 nm, for silicon layer 9;
- a thickness in the range from 5 to 20 nm, for example, 10 nm, for insulating layers 19 and 13;
- a thickness in the range from 10 to 50 nm, for example, 25 nm, for layers 15 and 17;
- a thickness in the range from 5 to 30 nm, for example, 15 nm, for insulating sheath 23;
- a width from 0.1 to 0.3 µm, for example, 0.2 µm, for opening 21; and
- a thickness in the range from 50 to 200 nm, for example, 75 nm, for the silicon layer deposited at the step of FIG. 5.

The doping levels of the various previously-described layers, regions, portions will be selected conventionally.

Specific embodiments have been described. Various alterations, modifications, and improvements will occur to those skilled in the art. In particular, the number and the order of the steps of the previously-described method may be adapted by those skilled in the art. For example, the steps of cleaning the exposed surfaces of the semiconductor regions from which the epitaxies are performed may be provided before each epitaxy step. At the steps of FIGS. 5 and 6, additional spacers may be provided on the side of emitter region 31. During the step of forming collector region 25, only a central and/or lower portion of region 25 may be doped by selective implantation of dopant atoms. The insulating structures 3 shown in FIG. 1 may be formed before the deposition of each of the layers forming the stack of layers 11, particularly in the case where silicon layer 9 is the silicon layer of an SOI-type structure.

It will readily occur to those skilled in the art that the previously-indicated conductivity types may all be inverted.

Further, the insulating materials of sheath 23 and of layers 13, 15, and 17 may be selected differently provided to keep the etch selectivity of layers 13, 15, 17 and of sheath 23 such as previously described.

Although an embodiment of a method where base region 27 is made of silicon-germanium has been described, region 27 may also be formed by epitaxy of silicon, germanium, or another semiconductor material capable of growing by epitaxy from silicon and from which silicon can grow by epitaxy. For example, this method may be used to manufacture transistors using III-V semiconductors.

In the described method, stack 11 comprises a single layer 19 arranged under layer 15 and made of the same material as sheath 23. The stack may comprise additional layers arranged under layer 15 and made of the same material as sheath 23, provided that the additional layers are thinner than sheath 23, particularly than the lower portion of sheath 23 bordered by the additional layers. Stack 11 may also comprise one or a plurality of other insulating layers resting on layer 17.

Two embodiments have been described in detail. It will be within the abilities of those skilled in the art to combine various elements (materials forming the various layers, etch selectivity of the materials, etc.) of these two embodiments without showing any inventive step. Particularly, in the second embodiment, the step of replacing the upper portion of insulating sheath 23 such as described in relation with FIG. 3 may be omitted as in the first embodiment.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. A bipolar transistor, comprising:
   a single-crystal semiconductor substrate;
   a doped semiconductor collector region of a first conductivity type resting on the single-crystal semiconductor substrate;
   a doped base semiconductor region of a second conductivity type on top of the doped semiconductor collector region;
   an insulating sheath coating a side of the doped semiconductor collector region and being aligned with a side of the doped base semiconductor region;
   a doped silicon emitter region of the first conductivity type on the base semiconductor region and laterally extending beyond the base semiconductor region; and
   a stack surrounding the doped semiconductor collector region and bordering said insulating sheath along an entire height thereof, the stack located on the single-crystal semiconductor substrate and comprising a first insulating layer topped with a first semiconductor layer that is topped with a doped semiconductor base contact region of the second conductivity type laterally extending to a side of the doped base semiconductor region.

2. The bipolar transistor of claim 1, further comprising silicide portions arranged at a top of the emitter region, at a level of an upper surface of the single-crystal semiconductor substrate and at a level of an upper surface of the base contact region partly opposite the side of the doped base semiconductor region.

3. The transistor of claim 1, wherein an upper level of the doped semiconductor collector region is lower than or equal to a lower level of the base contact region.

4. A bipolar transistor, comprising:
a single-crystal silicon substrate;
a first insulating layer over the single-crystal silicon substrate;
a first silicon layer over the first insulating layer;
an opening extending through the first silicon layer and first insulating layer;
an insulating sheath covering lateral walls of the opening, said insulating sheath including a lateral opening;
in the opening, a collector region made of epitaxial silicon doped with a first conductivity type;
in the opening, a base region made of epitaxial semiconductor material doped with a second conductivity type, said base region in contact with the collector region, wherein a side of the base region is present at the lateral opening in the insulating sheath;
in the opening, an emitter region doped with the first conductivity type, said emitter region in contact with the base region; and
a base contact made of epitaxial silicon extending through the lateral opening in the insulating sheath to connect to both the base region and first silicon layer.

5. The transistor of claim 4, wherein the first silicon layer is a single-crystal layer of a structure of semiconductor-on-insulator type.

6. The transistor of claim 4, wherein the first silicon layer has a doping of the second conductivity type.

7. The transistor of claim 4, further comprising a first silicide on the first silicon layer providing a base terminal, a second silicide on the single-crystal silicon substrate providing a collector terminal and a third silicide on the emitter region providing an emitter terminal.

8. The transistor of claim 4, further comprising, insulating spacers resting on the base region and bordering the insulating sheath.

9. A bipolar transistor, comprising:
a semiconductor region doped with a first conductivity type in a semiconductor substrate;
a first insulating layer over the doped semiconductor collector region;
a first silicon layer over the first insulating layer;
an opening extending through the first silicon layer and the first insulating layer to the semiconductor substrate;
an insulating sheath covering lateral walls of the opening and including a lateral opening;
a collector region made of epitaxial semiconductor material doped with the first conductivity type and located in said opening in contact with the semiconductor region;
a base region made of epitaxial semiconductor material doped with a second conductivity type and located in said opening in contact with the collector region;
an emitter region made of semiconductor material doped with the first conductivity type and located in said opening in contact with the base region; and
a base contact region made of epitaxial semiconductor material extending through the lateral opening to connect the base region to the first silicon layer.

10. The transistor of claim 9, further comprising:
a first silicide on an upper surface of the first silicon layer; and
a second silicide on an upper surface of the emitter region.

11. The transistor of claim 10, further comprising a third silicide on an upper surface of the semiconductor region.

12. The transistor of claim 9, further comprising sidewall spacers in said opening on sidewalls of the insulating sheath and on a top surface of the base region.

* * * * *